United States Patent
Woo

(10) Patent No.: US 6,790,729 B1
(45) Date of Patent: Sep. 14, 2004

(54) METHOD OF MANUFACTURING NAND FLASH MEMORY DEVICE

(75) Inventor: Won Sic Woo, Kuri-shi (KR)

(73) Assignee: Hynix Semiconductor Inc., Kyungki-do (KR)

(*) Notice: Subject to any disclaimer, the term of this patent is extended or adjusted under 35 U.S.C. 154(b) by 0 days.

(21) Appl. No.: 10/720,863

(22) Filed: Nov. 24, 2003

(30) Foreign Application Priority Data

Apr. 3, 2003 (KR) .................................. 10-2003-0021059

(51) Int. Cl.[7] ............................................. H01L 21/336
(52) U.S. Cl. ....................... 438/257; 438/239; 438/241; 438/243; 438/244; 438/250
(58) Field of Search ..................... 438/239, 241–243, 438/396, 399, 250, 253, 257

(56) References Cited

U.S. PATENT DOCUMENTS

| | | | |
|---|---|---|---|
| 2002/0081806 A1 * | 6/2002 | Shin et al. ................... | 438/257 |
| 2002/0100930 A1 * | 8/2002 | Yaegashi ..................... | 257/315 |
| 2003/0151069 A1 * | 8/2003 | Sugimae et al. ............ | 257/200 |
| 2003/0201491 A1 * | 10/2003 | Chung ........................ | 257/324 |

\* cited by examiner

*Primary Examiner*—David A. Zarneke
*Assistant Examiner*—Thanh Y. Tran
(74) *Attorney, Agent, or Firm*—Marshall, Gerstein & Borun LLP

(57) ABSTRACT

The present invention relates to a method of manufacturing a NAND flash memory device. Drain select transistors, source select transistors and memory cells are formed in a cell region. After forming peri-transistors in a peripheral circuit region, a metal contact process for electrically connecting them is performed. Upon the metal contact process, the common source line connecting a source region of each of the source select transistors is formed, by patterning the interlayer insulating film to expose the source regions, removing the isolation films between respective source regions to form a common source line contact hole, forming an ion implantation region in the semiconductor substrate at the bottom of the common source line contact hole by means of an ion implantation process, forming a conductive layer so that the common source line contact hole is filled, and blanket-etching the interlayer insulating film as well as the conductive layer by a given thickness. The common source line has a reduced electrical resistance that much since the conductive layer is buried into the removed portion of the isolation film as well as the impurity region formed by the ion implantation process. Due to this, the height of the interlayer insulating film relating to the resistance of the common source line can be lowered. As a result, the aspect ratio is reduced to facilitate a subsequent contact process.

10 Claims, 12 Drawing Sheets

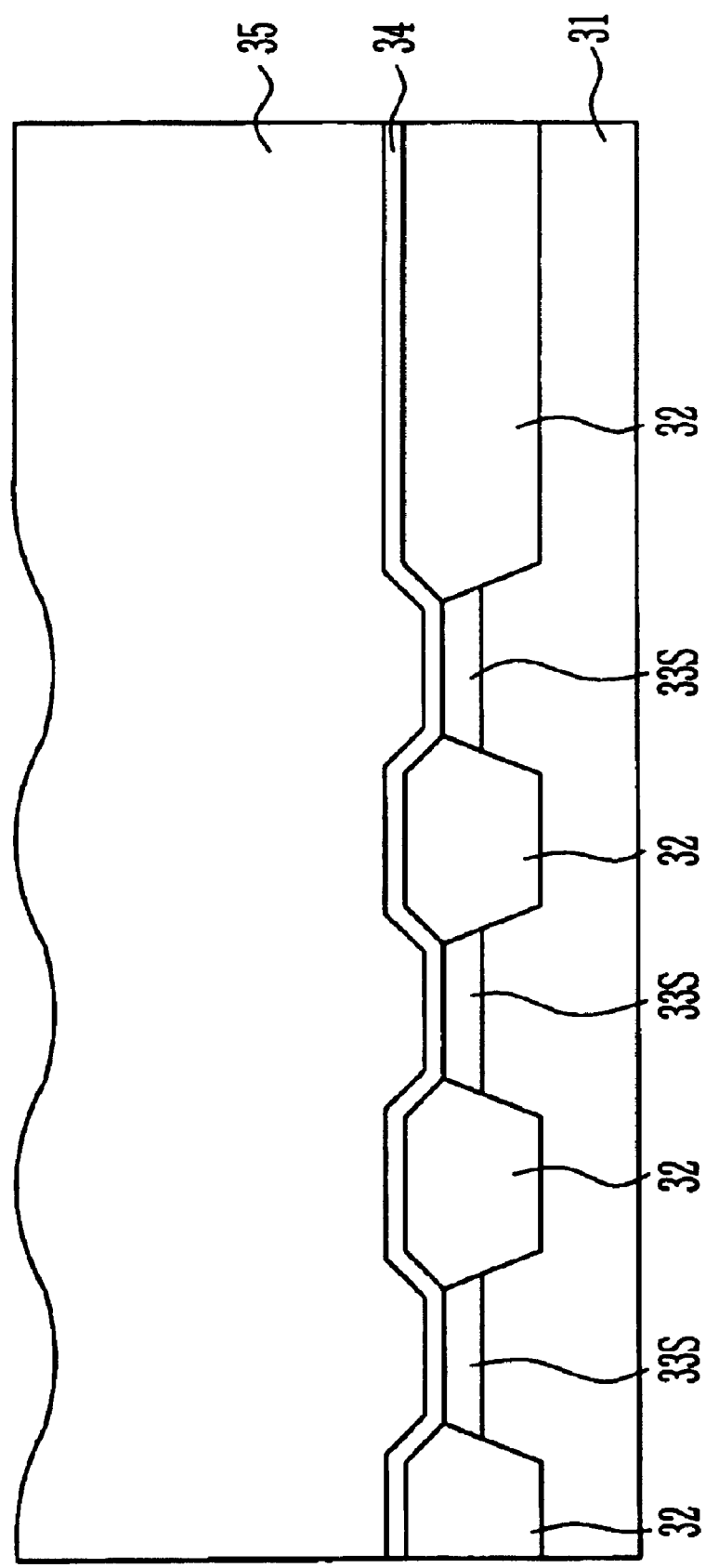

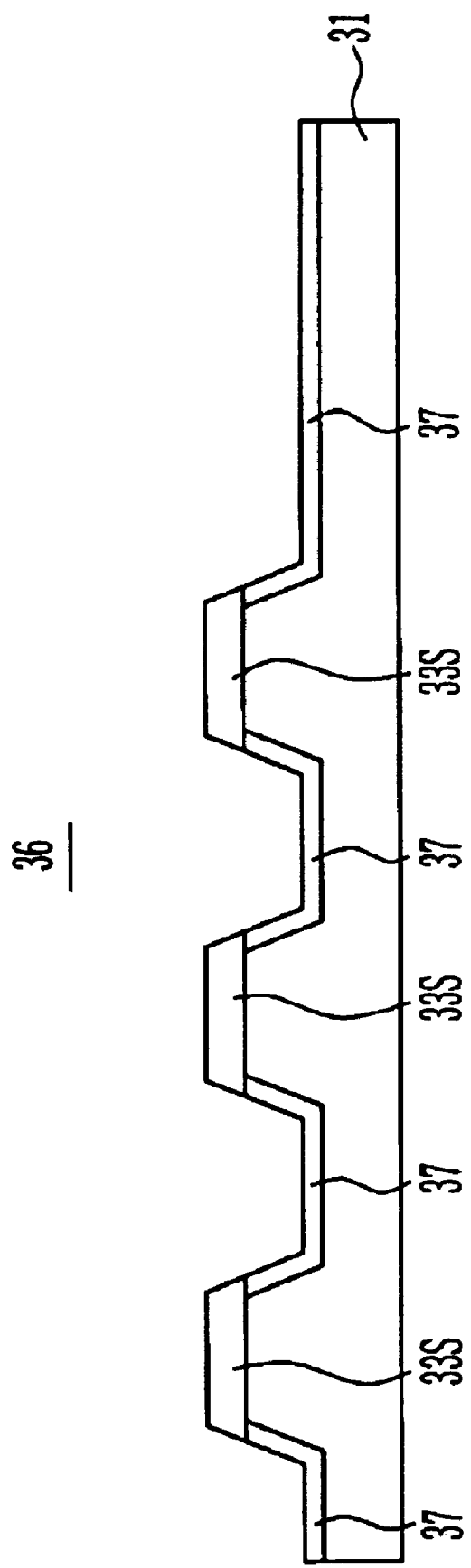

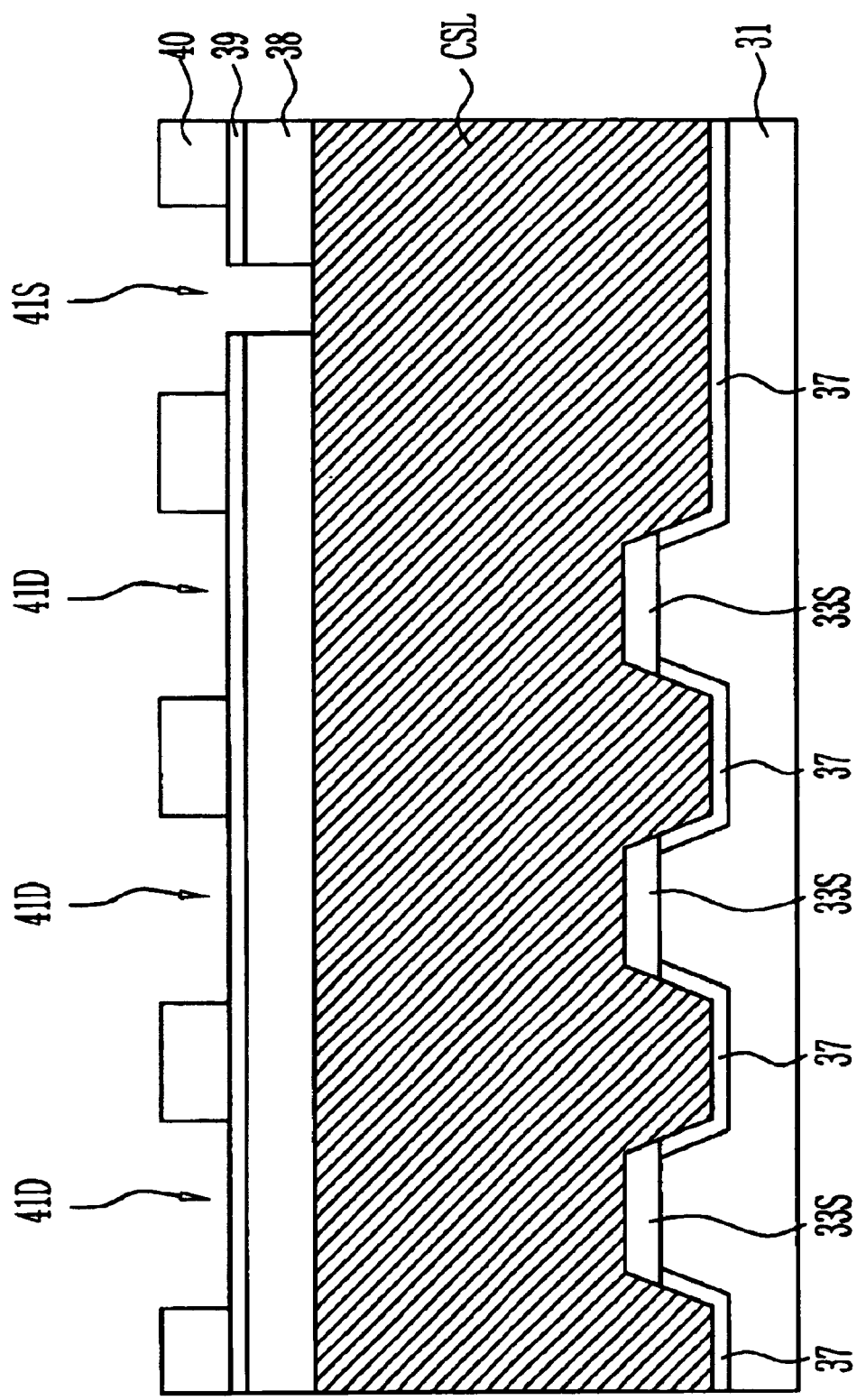

METHOD OF MANUFACTURING NAND FLASH MEMORY DEVICE

BACKGROUND

1. Field of the Invention

The present invention relates to a method of manufacturing a NAND flash memory device and, more particularly, to a method of manufacturing a NAND flash memory device capable of reducing the aspect ratio upon a metal contact process.

2. Discussion of Related Art

Information stored at the cells of a non-volatile memory device such as a flash memory device is not erased even when the power is off. For this reason, the flash memory device has been widely used in memory cards, etc. The flash memory device may be classified into two types. One of them is a NAND type flash memory device and the other is an OR type flash memory device.

The NAND flash memory device largely includes a cell region and a peripheral circuit region. The cell region consists of a plurality of strings, wherein a source select transistor, a plurality of memory cells and a drain select transistor are serially connected to each string. A source region of the source select transistor is connected to a common source line and a drain region of the drain select transistor is connected to a bit line. The peripheral circuit region consists of peri-transistors such as PMOS transistors, NMOS transistors, etc.

Meanwhile, a cell region of the NOR flash memory device includes a plurality of memory cells, bit lines and common source lines. Only a single memory cell is intervened between the bit lines and the common source lines.

Therefore, the NAND flash memory device has a higher integration level than the NOR flash memory device but requires a high cell current. At this time, the cell current means a current flowing into the bit lines and the common source lines while information stored at the memory cells is being read. Accordingly, more effort to increase the cell current in the NAND flash memory device is required than in.the NOR flash memory device. The reason is that the larger the cell current, the faster the access time of the flash memory device. As a result, in order to improve the operating speed of the NAND flash memory device, it is required to reduce the electrical resistance of the bit lines and/or the common source lines.

FIG. 1A is a cross-sectional view of a NAND flash memory device for explaining a conventional method of manufacturing the device, and FIG. 1B is a cross-sectional view of the NAND flash memory device that is taken along a region where a common source line will be formed in order to explain the conventional method of manufacturing the NAND flash memory device.

Referring to FIGS. 1A and 1B a plurality of isolation films 12 are formed in parallel to each other in given regions of a semiconductor substrate 11 to define an active region. The isolation films 12 are formed by means of a local oxidation of silicon (LOCOS) process or a trench isolation process. The trench isolation process has recently been widely used for a high integration of the device. The NAND flash memory device can be largely classified into a cell region and a peripheral circuit region. The cell region includes a plurality of strings, wherein a source select transistor SST, a plurality of memory cells MC1, . . . , MCn and a drain select transistor DST are serially connected to each string. A peri-transistor PT such as a PMOS transistor, a NMOS transistor, etc. is formed in the peripheral circuit region. Thereafter, a metal contact process for electrically connecting them is performed, which will be described later.

An etch-stop film 14 is formed on the entire structure. A first interlayer insulating film 15 is then formed on the resulting entire structure on which the etch-stop film 14 is formed. The surface of the first interlayer insulating film 15 is polished by means of a chemical mechanical polishing (CMP) process. The first interlayer insulating film 15 and the etch-stop film 14 are then etched by means of an etch process using a mask for the common source line, thus forming a common source line contact hole through which a cell source region 13S and the isolation films 12 are exposed. Next, a doped polysilicon layer is formed so that the common source line contact hole is filled. The doped polysilicon layer is then blanket-etched so that the first interlayer insulating film 15 is exposed, thereby forming a common source line CSL. This series of the process is referred to as so called a cell source poly plug process.

A second interlayer insulating film 18 is formed on the first interlayer insulating film 15 including the common source line CSL. The second interlayer insulating film 18, the first interlayer insulating film 15 and the etch-stop film 14 are then etched by means of an etch process using a mask for a drain contact, thus forming cell drain contact holes through which each cell drain region 13D is exposed. After forming a doped polysilicon layer so that the cell drain contact holes are buried, the doped polysilicon layer is blanket-etched so that the second interlayer insulating film 18 is exposed, thus forming cell drain contact plugs DCP. This series of the process is referred to as so called a cell drain poly plug process.

A trench nitride film 19 and a trench oxide film 20 are sequentially formed on the second interlayer insulating film 18 including the cell drain contact plugs (DCP). Next, damascene patterns are formed by a damascene process. After depositing a metal so that the damascene patterns are buried, a blanket etch process is implemented to form a metal wire 22S connected to the common source line CSL, a bit line 22D connected to the drain contact plug DCP, a metal wire 22G connected to a gate of the peri-transistor PT, and a metal wire 22P connected to a source/drain junction 13P of the peri-transistor PT.

As described above, according to the prior art, the thickness of the common source line CSL is decided by the first interlayer insulating film 15. In other words, the thicker the thickness of the first interlayer insulating film 15, the smaller the electrical resistance of the common source line CSL. Considering the electrical resistance of the common source line CSL, therefore, there is a limit in reducing the thickness of the first interlayer insulating film 15. Due to this, as this causes the aspect ratio to increase in a subsequent metal contact process, in particular the cell drain contact process, there is no choice but to first form the cell drain contact plug DCP. In case where the aspect ratio is severe, there is a difficulty in process that there is no choice but to perform a contact process for forming the metal wire 22G connected to the gate of the peri-transistor PT and the metal wire 22P connected to the source/drain junction 13P of the peri-transistor PT as an additional mask process.

Thus, in order to implement a high-performance NAND flash memory device, it is necessary to minimize the resistance of the common source line while preventing an increase in the aspect ratio of the contact hole for connecting the bit line 22D to the cell drain region 13D.

SUMMARY OF THE INVENTION

The present invention is contrived to solve the aforementioned problems. The present invention is directed to provide a method of manufacturing a NAND flash memory device capable of reducing the aspect ratio of a drain contact hole while reducing the resistance of a common source line.

One aspect of the present invention is to provide a method of manufacturing a NAND flash memory device, comprising the steps of: providing a semiconductor substrate in which a plurality of isolation films are formed in parallel to each other, a source select transistor having a cell source region, a plurality of memory cells having a cell impurity region and a drain select transistor having a cell drain region are serially connected and formed in each of a plurality of strings in a cell region, and a peri-transistor having a source/drain junction is formed in a peripheral circuit region; forming a first interlayer insulating film on the resulting semiconductor substrate; etching a portion of the first interlayer insulating film to expose the cell source regions and the isolation films between the regions, and then etching the exposed portions of the isolation films to form a common source line contact hole through which the semiconductor substrate is exposed; performing an ion implantation process to form an ion implantation region on the exposed semiconductor substrate at the bottom of the common source line contact hole; and burying a conductive material within the common source line contact hole in which the ion implantation region is formed, thus forming a common source line.

In the aforementioned of a method of manufacturing a NAND flash memory device according to another embodiment of the present invention, before the step of forming the first interlayer insulating film, further comprising the step of forming an etch-stop film having a higher etch selective ratio than that of the first interlayer insulating film on the resulting semiconductor substrate.

In the aforementioned of a method of manufacturing a NAND flash memory device according to another embodiment of the present invention, the step of forming the common source line contact hole comprises the steps of: etching a portion of the first interlayer insulating film to expose the etch-stop film; and etching the exposed etch-stop film to expose the cell source regions and the isolation films between the regions and then etching the exposed isolation films to expose the semiconductor substrate.

In the aforementioned of a method of manufacturing a NAND flash memory device according to another embodiment of the present invention, the common source line contact hole includes, at its bottom, a continuous conductive line consisting of the cell source regions and the ion implantation regions formed between the cell source regions.

In the aforementioned of a method of manufacturing a NAND flash memory device according to another embodiment of the present invention, the impurity ion implantation process is performed at a dose of 1E12 to 1E14 atom/cm$^2$ with an implantation energy of 15 keV to 25 KeV, using arsenic or phosphorous as an impurity ion.

In the aforementioned of a method of manufacturing a NAND flash memory device according to another embodiment of the present invention, the impurity ion implantation process is performed simultaneously with tilt implantation.

In the aforementioned of a method of manufacturing a NAND flash memory device according to another embodiment of the present invention, at the time of the tilt implantation, a wafer is rotated.

In the aforementioned of a method of manufacturing a NAND flash memory device according to another embodiment of the present invention, the step of forming the common source line comprises the steps of: depositing a doped polysilicon as the conductive material on the first interlayer insulating film so that the common source line contact hole, in which the ion implantation region is formed, is buried; and etching the deposited doped polysilicon layer until the first interlayer insulating film is removed to a given thickness by means of a blanket etch process.

In the aforementioned of a method of manufacturing a NAND flash memory device according to another embodiment of the present invention, the blanket etch process is performed until the top surface of the source select transistor is exposed.

In the aforementioned of a method of manufacturing a NAND flash memory device according to another embodiment of the present invention, after the step of forming the common source line, further comprising the steps of; forming a second interlayer insulating film on the first interlayer insulating film including the common source line; forming a trench etch-stop film and a trench insulating film on the second interlayer insulating film sequentially; forming a plurality of damascene patterns simultaneously by means of a damascene process; and burying a metal within the damascene patterns to form a metal wire connected to the common source line, a bit line connected to the cell drain region, a metal wire connected to a gate of the peri-transistor, and a metal wire connected to the source/drain junction of the peri-transistor, separately.

BRIEF DESCRIPTION OF THE DRAWINGS

The above and other objects, features and advantages of the present invention will become apparent from the following description of preferred embodiments given in conjunction with the accompanying drawings, in which;

FIGS. 2B, 3B, 4B, 5B and 6B are cross-sectional views taken along regions where common source lines will be formed, in order to explain a method of manufacturing a NAND flash memory device according to embodiments of the present invention.

DETAILED DESCRIPTION OF PREFERRED EMBODIMENTS

Figure 1A:
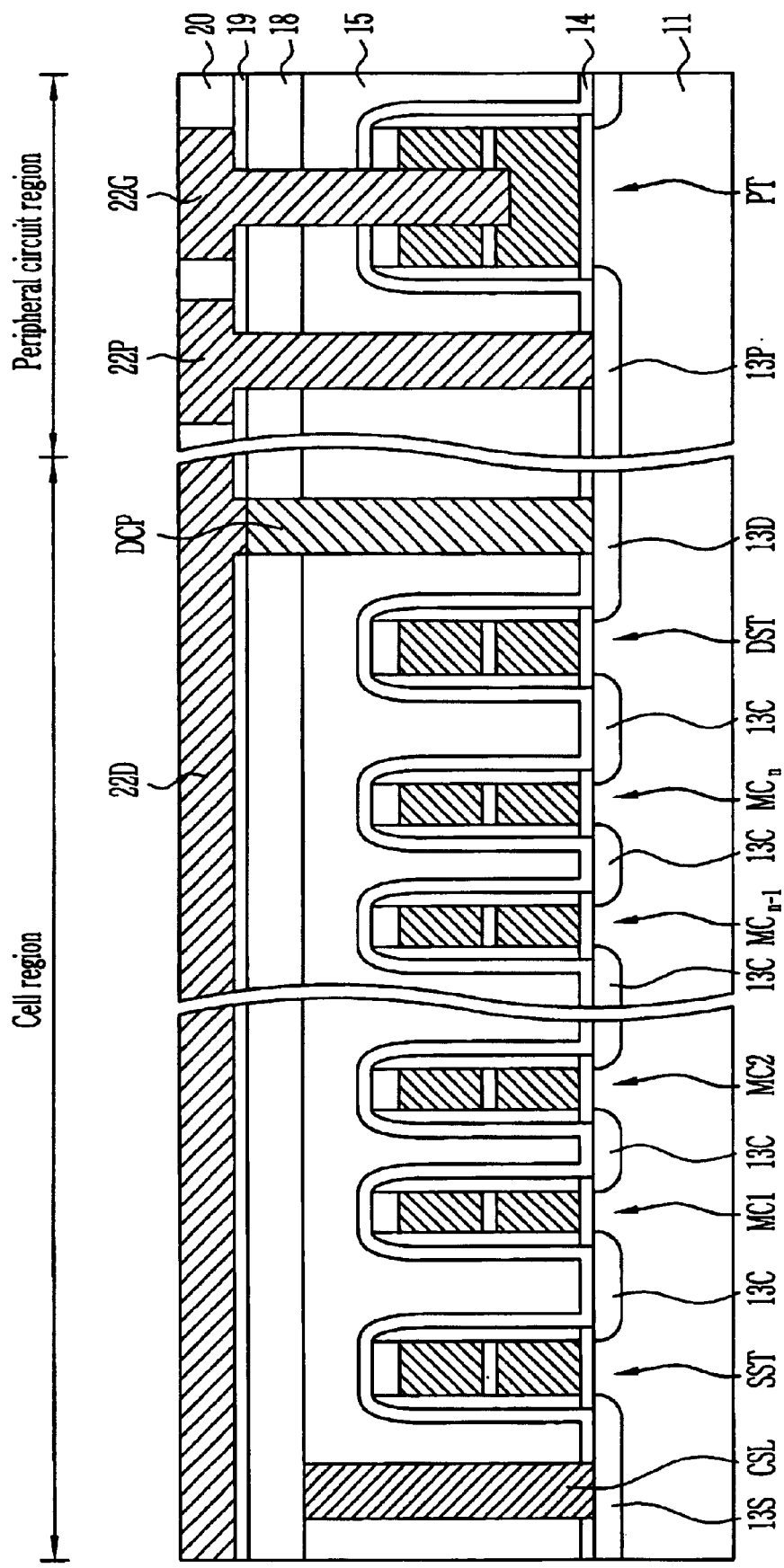
FIG. 1A is a cross-sectional view for explaining a NAND flash memory device according to a conventional method.
Figure 1B:
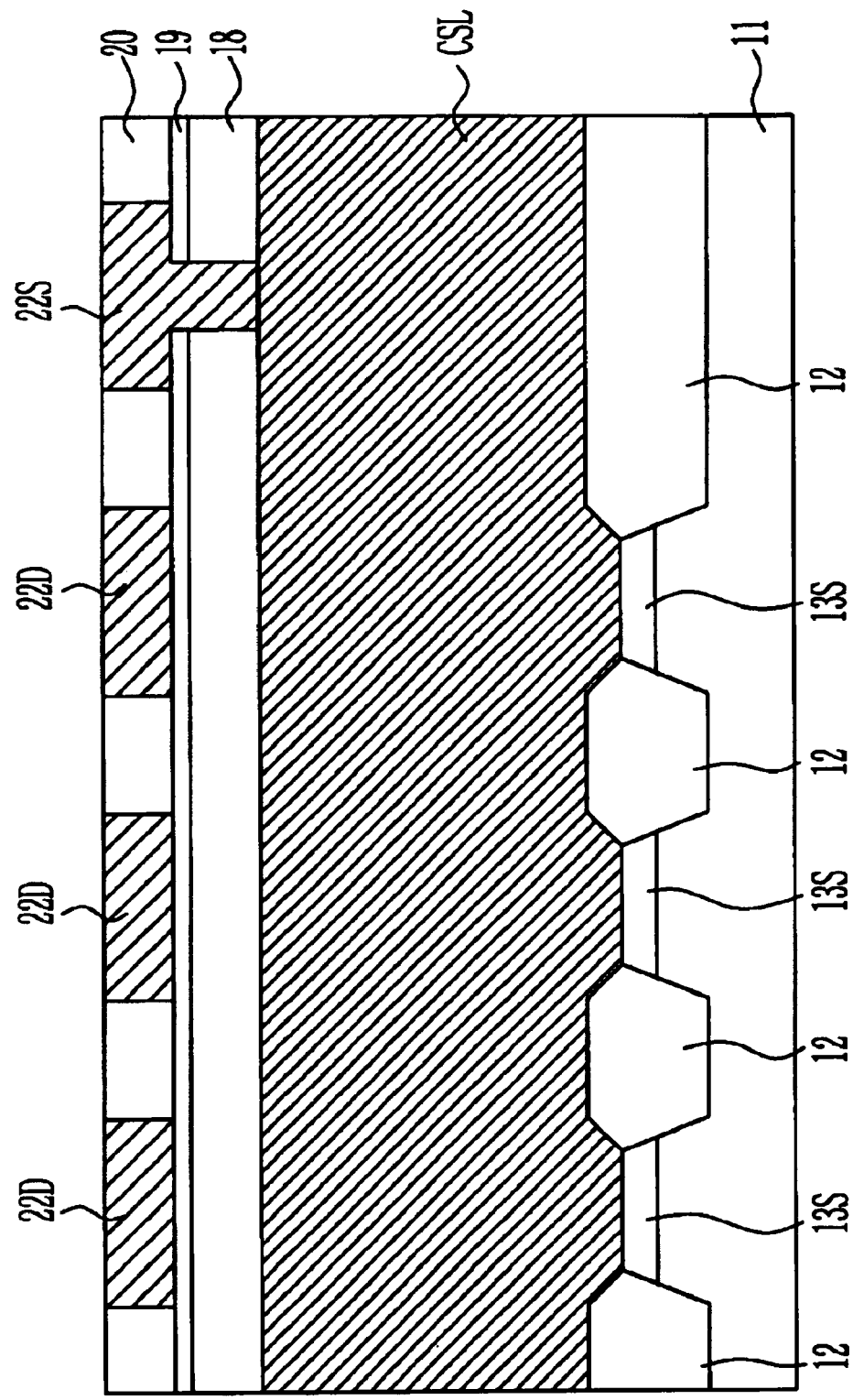
FIG. 1B is a cross-sectional view for explaining a NAND flash memory device taken along a region, where a common source line will be formed, according to a conventional method.

The present invention will now be described in detail in connection with preferred embodiments with reference to the accompanying drawings, in which like reference numerals are used to identify the same or similar parts.

FIGS. 2A, 3A, 4A, 5A and 6A are cross-sectional views of NAND flash memory devices for explaining a method of manufacturing the device according to embodiments of the present invention, and FIGS. 2B, 3B, 4B, 5B and 6B are cross-sectional views taken along regions where common source lines will be formed, in order to explain a method of manufacturing a NAND flash memory device according to embodiments of the present invention.

Figure 2A:
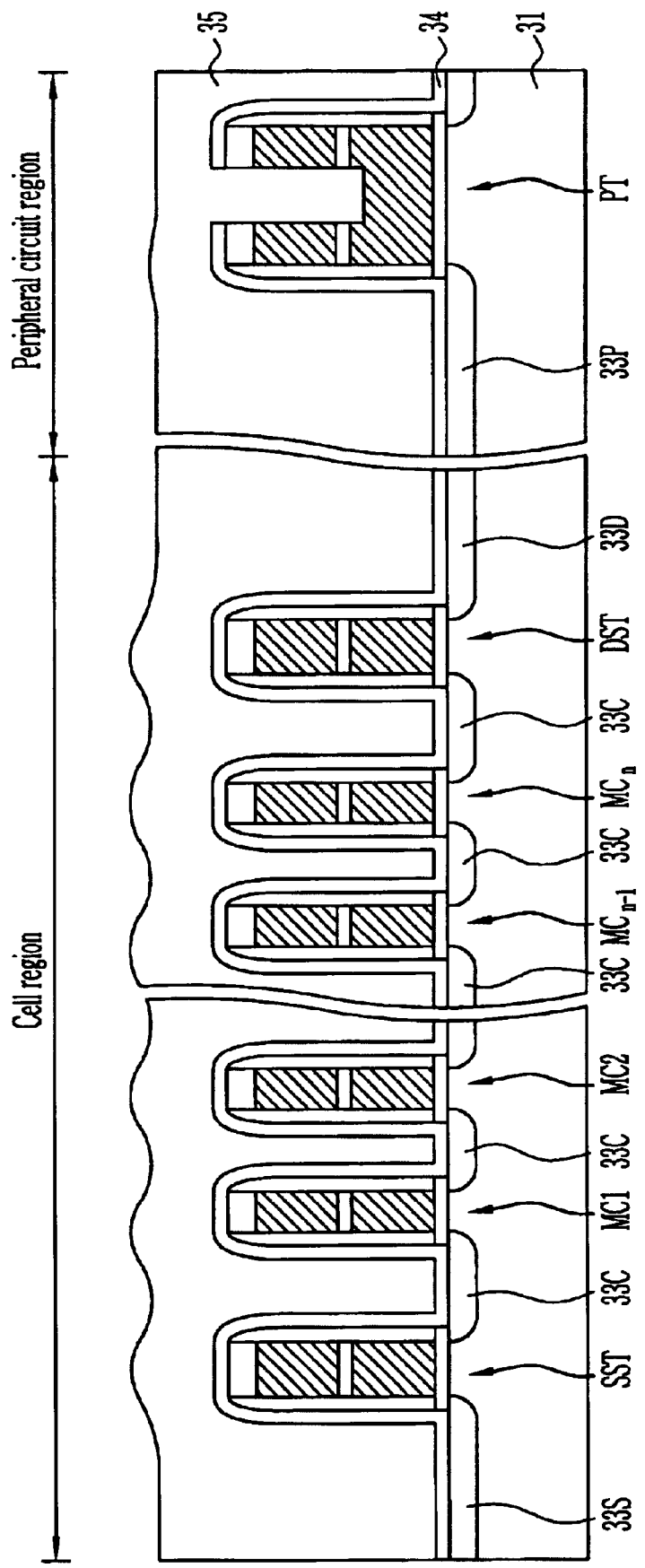
FIGS. 2A, 3A, 4A, 5A and 6A are cross-sectional views of NAND flash memory devices for explaining a method of manufacturing the device according to embodiments of the present invention.

Referring to FIGS. 2A and 2B, a plurality of isolation films 32 that are formed in parallel to each other in given regions of a semiconductor substrate 31, thus defining an active region. The isolation films 32 are formed by means of a local oxidation of silicon (LOCOS) process or a trench isolation process. It is preferred that the isolation films 32 are formed by the trench isolation process for higher integration of the device. The NAND flash memory device can be largely classified into a cell region and a peripheral circuit region. The cell region includes a plurality of strings, wherein a source select transistor SST, a plurality of memory cells MC1, . . . , MCn and a drain select transistor DST are serially connected to each string. A peri-transistor PT such as a PMOS transistor, a NMOS transistor, etc. is formed in the peripheral circuit region. The source select transistor SST has a cell source region 33S, the plurality of the memory cells MC1, . . . , MCn have cell impurity regions 33C, the drain select transistor DST has a cell drain region 33D and the peri-transistor PT has a source/drain junction 33P. An etch-stop film 34 is formed on the resulting entire structure. A first interlayer insulating film 35 is then formed on the resulting entire structure on which the etch-stop film 34 is formed.

In the above, the etch-stop film 34 is formed by depositing an insulating material having a higher etch selective ratio than a first interlayer insulating film 35 to be formed in a subsequent process, for example, silicon nitride in a thickness of about 100 to 500 Å on the resulting entire surface. The first interlayer insulating film 35 is formed by depositing boron phosphorous silicate glass (BPSG), undoped silicate glass (USG) and high density plasma (HDP), which are an oxide series, in thickness of about 4000 to 5000 Å.

Figure 3A:
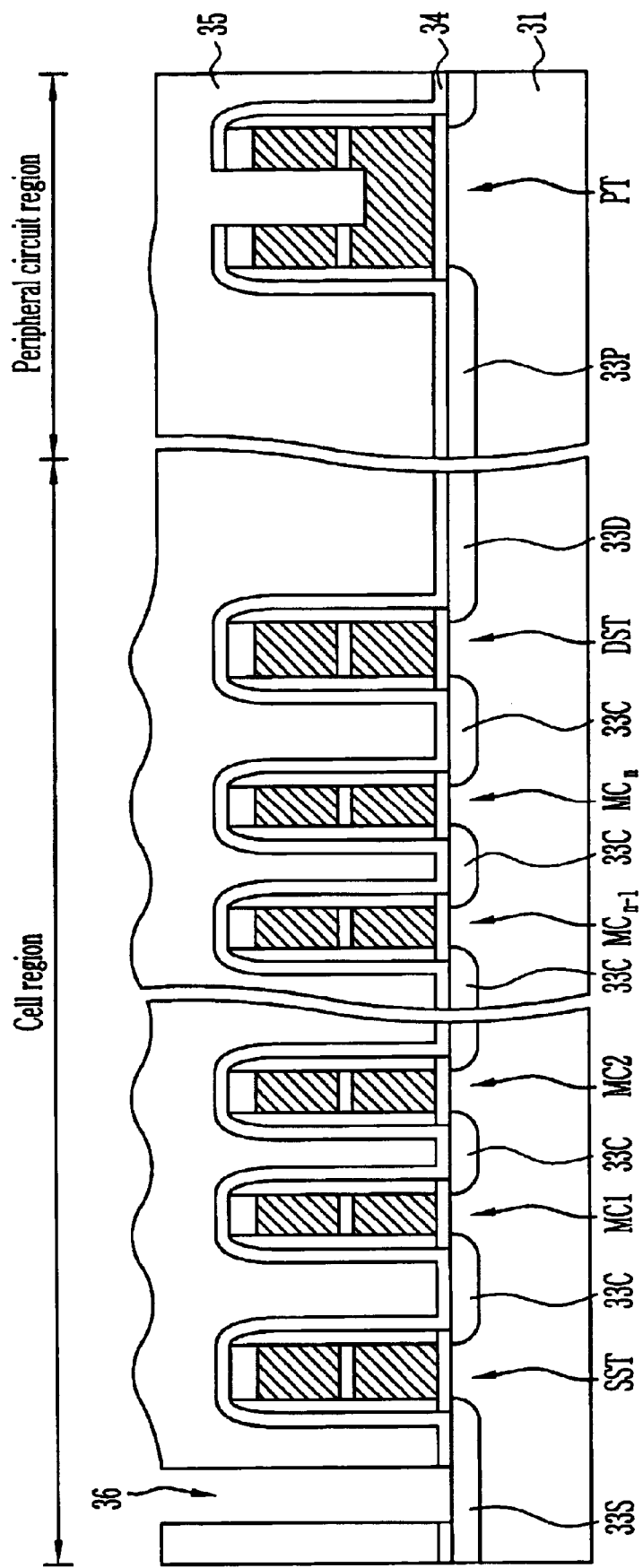

By reference to FIGS. 3A and 3B, the first interlayer insulating film 35 and the etch-stop film 34 are etched by means of an etch process using a mask (not shown) for a common source line. Exposed portions of the isolation films 32 between respective cell source regions 33S are then etched to form a common source line contact hole 36 through which portions of the cell source regions 33S and the semiconductor substrate 31 are exposed. Ion implantation regions 37 are formed on the semiconductor substrate 31 at the bottom of the common source line contact hole 36 by means of an impurity ion implantation process. Due to this, the bottom of the common source line contact hole 36 becomes a continuous conductive line by means of the cell source regions 33S and the ion implantation regions 37 formed between the regions 33S.

In the above, as the etch process for forming the common source line contact hole 36 must be performed to etch even the isolation films 32, the exposed portions of the cell source regions 33S are experienced by etch damage and electrical characteristic may be thus degraded.

However, impurity ions are implanted in a subsequent impurity ion implantation process to improve electrical characteristics. The ion implantation process is performed at a dose of 1E12 to 1E14 atom/cm$^2$ with an implantation energy of 15 keV to 25 KeV. At this time, an impurity used may be arsenic (As) or phosphorous (P). In order for the ion implantation region 37 to be preferably formed at tilt portions of the semiconductor substrate 31 from which the isolation films 32 are removed, it is preferred that the tilt implantation is simultaneously performed during the ion implantation process. It is further preferred that the tilt implantation is performed a wafer is rotated.

Meanwhile, in the process of removing the isolation films 32 by the etch process, it is preferred that the isolation films 32 are completely removed. If there is a danger that the etch damage of the cell source regions 33S might become severe, however, the isolation films 32 may not be completely removed. In this case, as the cell source regions 33S and the ion implantation regions 37 formed between the regions 33S become discontinuous at the bottom of the common source line contact hole 36, it may be disadvantageous in terms of electrical resistance compared to the case where the cell source regions 33S and the ion implantation regions 37 are continuous. As all the cell source regions 33S and the discontinuous ion implantation region 37 are electrically connected by the common source line formed in a subsequent process, however, there is no significant effect.

Furthermore, although the etch process using the mask for the common source line is usually performed after the surface of the first interlayer insulating film 35 is polished by the CMP process, the polishing process may be omitted in the present invention. The reason is that the first interlayer insulating film 35 is sufficiently removed by a given thickness in a blanket etch process for forming the common source line and the surface is resultantly polished, which can be understood by explaining a subsequent process.

Figure 4A:
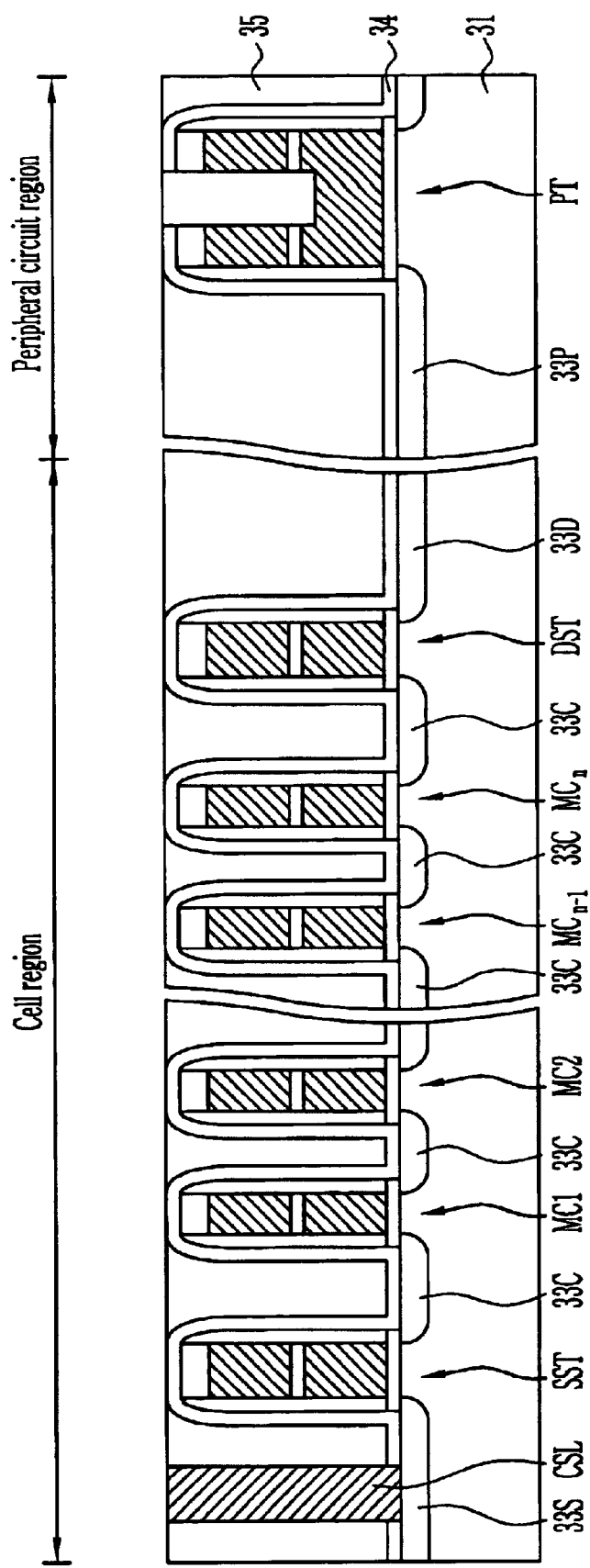
Figure 4B:
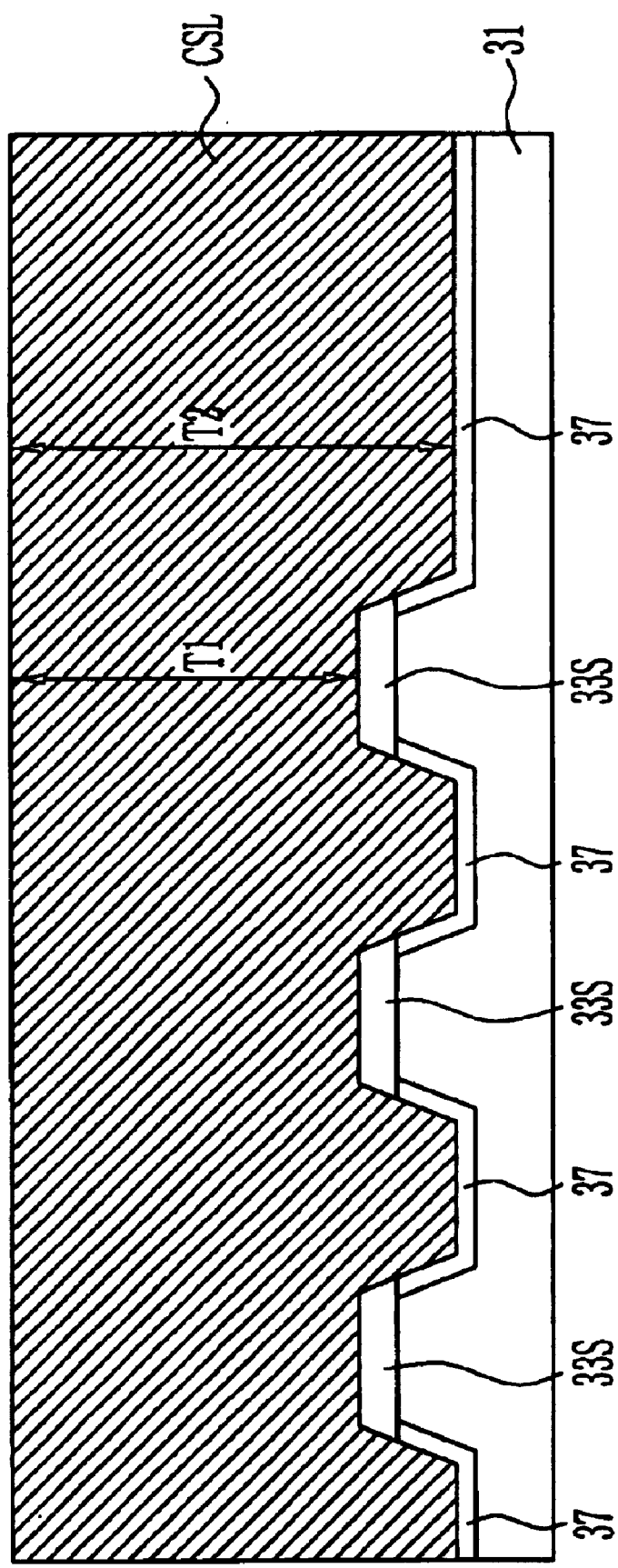

With reference to FIGS. 4A and 4B, a conductive material of about 4000 to 5000 Å, preferably doped polysilicon is deposited on the first interlayer insulating film 35 so that the common source line contact hole 36 is buried. Etch is then performed, by means of a blanket etch process, in a possible thickness that can remove not only the first interlayer insulating film 35 but also the doped polysilicon layer, preferably up to a point where the etch-stop film 34 on the top of the source select transistor SST is exposed, so that a common source line CSL into which doped polysilicon is buried is formed within the common source line contact hole 36. This process is referred to as so called a cell source poly plug process.

In the above, the first interlayer insulating film 35 is removed by maximum in the process of forming the common source line CSL of the present invention. For this reason, its height is lowered by that thickness compared to the existing process of forming the common source line. Therefore, the present process has an advantage that it can reduce the aspect ratio of a subsequent process. As shown in FIG. 5B, however, as the thickness "T1" on the cell source region 33S becomes thinner than that of the existing common source line, there is a disadvantage that electrical resistance is increased. In the common source line CSL of the present invention, however, doped polysilicon is buried within the portion from which the isolation film 32 is removed and the thickness "T2" at that portion becomes relatively thick. Further, as the common source line CSL includes the ion implantation region 37 formed in the semiconductor substrate 31 at the portion from which the isolation film 32 is removed, it is possible to reduce electrical resistance that much. Accordingly, it is not disadvantageous in terms of electrical resistance of the common source line compared to the existing device. In other words, as the height of the first interlayer insulating film 35 relating to the resistance of the common source line CSL can be lowered, the aspect ratio of a subsequent process can be reduced.

Figure 5A:
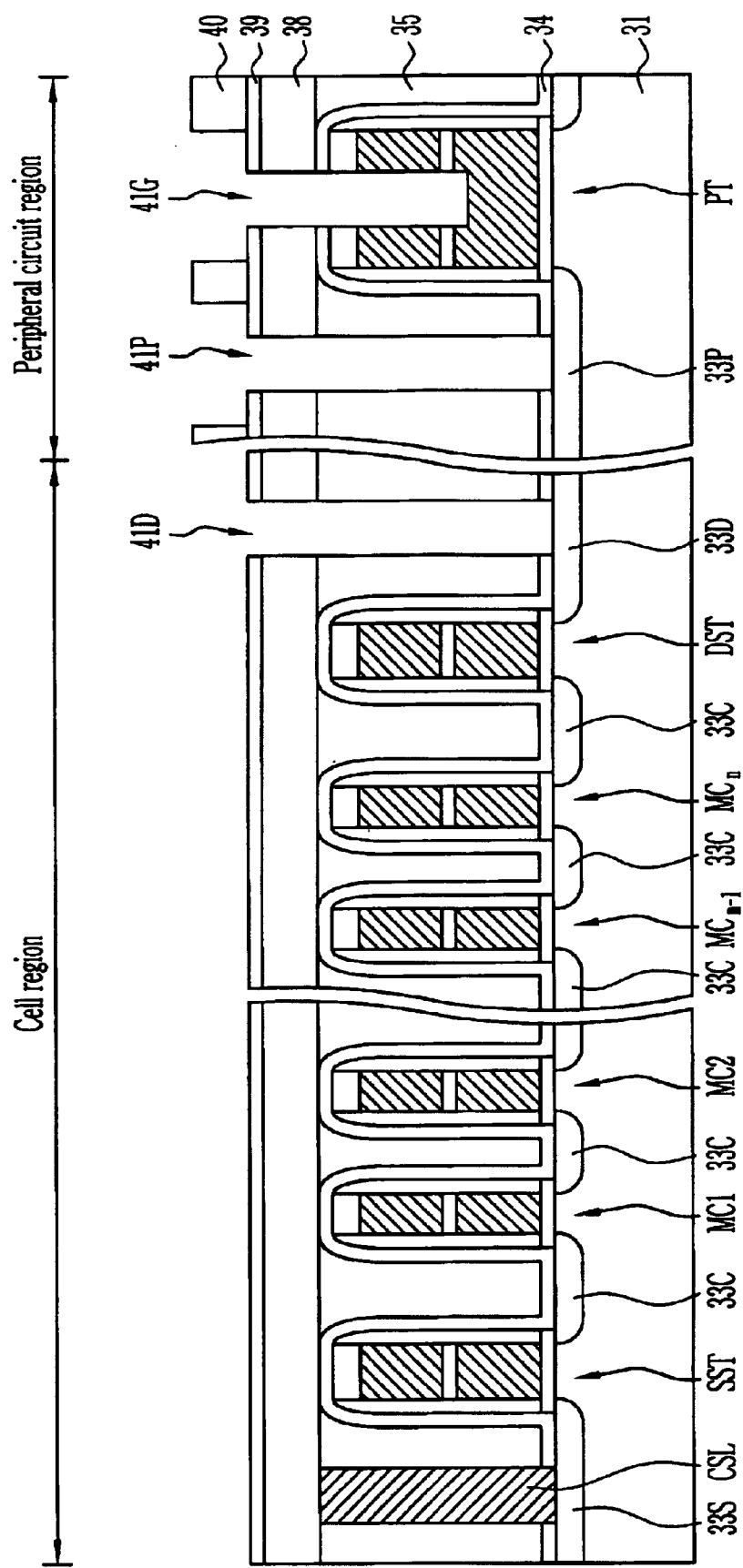

Referring to FIGS. 5A and 5B, a second interlayer insulating film 38 is formed on the first interlayer insulating film 35 including the common source line CSL. The surface of the film 38 is then polished by means of the CMP process, etc. A trench etch-stop film 39 and a trench insulating film 40 are sequentially formed on the second interlayer insulating film 38 and damascene patterns 41S, 41D, 41P and 41G are formed at the same time by means of the damascene process.

In the above, the second interlayer insulating film 38 is formed by depositing boron phosphorous silicate glass (BPSG), undoped silicate glass (USG) and high density plasma (HDP), which are an oxide series, in thickness of about 4000 to 5000 Å. Further, the trench etch-stop film 39 is formed by depositing an insulating material having a higher etch selective ratio than a trench insulating film 40 that will be formed in a subsequent process, for example, silicon nitride in thickness of about 100 to 500 Å on the second interlayer insulating film 38. The trench insulating film 40 is formed by depositing BPSG, USG and HDP, which are an oxide series, in thickness of about 2500 to 3500 Å.

Each of the damascene pattern 41S for the common source line contact, the damascene pattern 41D for the cell drain contact, the damascene pattern 41P for the source/drain contact of the peri-transistor and the damascene pattern 41G for the gate contact of the peri-transistor, is formed at the same time by means of a single damascene process. This is possible due to the lowered aspect ratio at the contact hole portion of each of the damascene patterns 41S, 41D, 41P and 41G since the first interlayer insulating film 34 was etched by maximum in the process of forming the common source line CSL as described above. In case of the contact hole portion of the cell drain region 33D where the aspect ratio is the highest and dense, in the prior art, there was no choice but to first form the cell drain contact plug within the contact hole by performing the cell drain poly plug process and to then form the bit line using additional process, since the aspect ratio is high as much as 11:1. In the present invention, however, as the aspect ratio can be reduced about 8.5:1, it is possible to bury the metal within the contact hole without the cell drain contact plug process.

Meanwhile, the NAND flash memory device can be fabricated by sequentially applying the process for forming the common source line CSL of the present invention and a common method not the method that has been described in the embodiment of the present invention, i.e., a common method in which the cell drain contact plug process, etc. is used. In this case, simplification of the process cannot be obtained but stability of the process can be obtained due to the reduced aspect ratio. Thus, the process margin of the device can be increased.

Figure 6A:
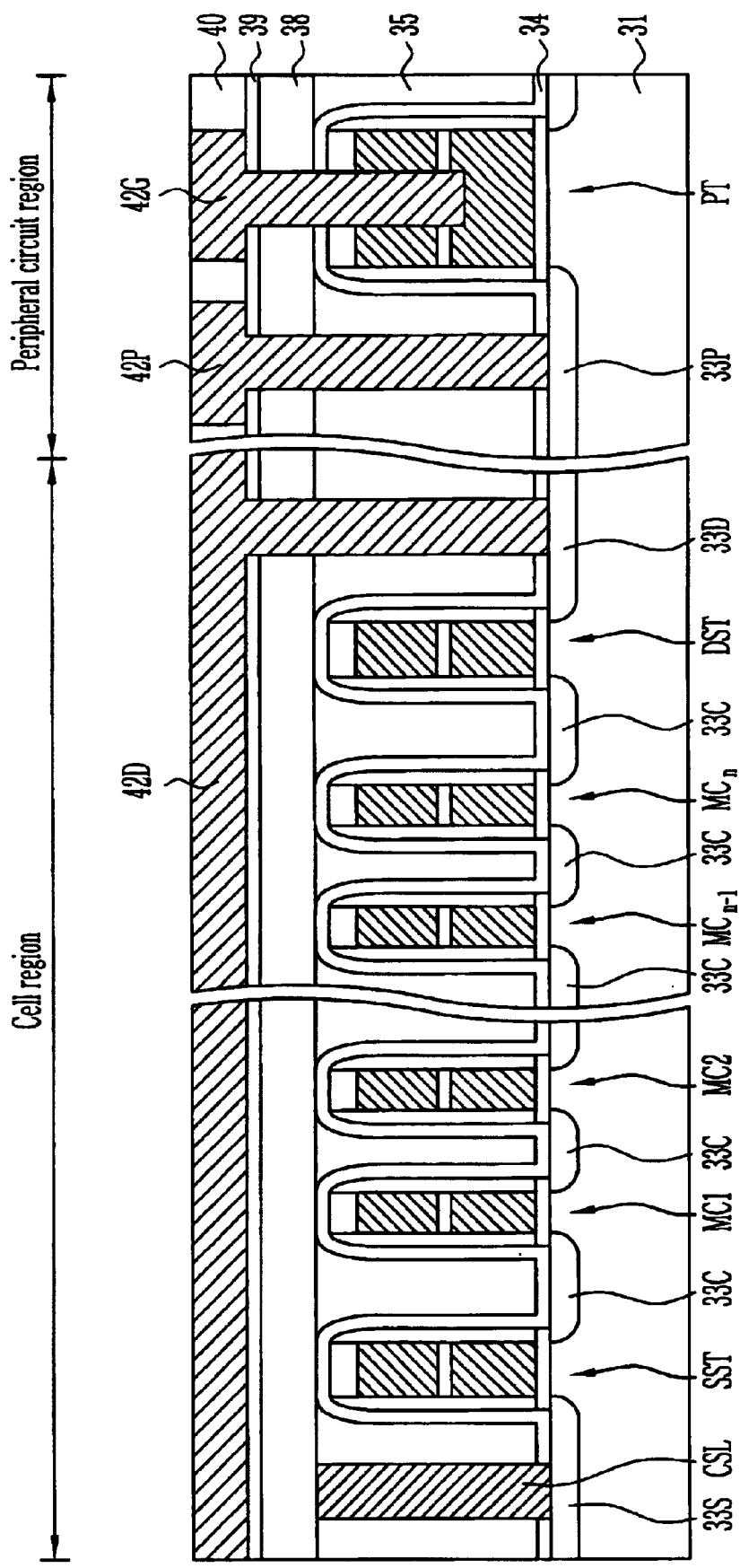
Figure 6B:
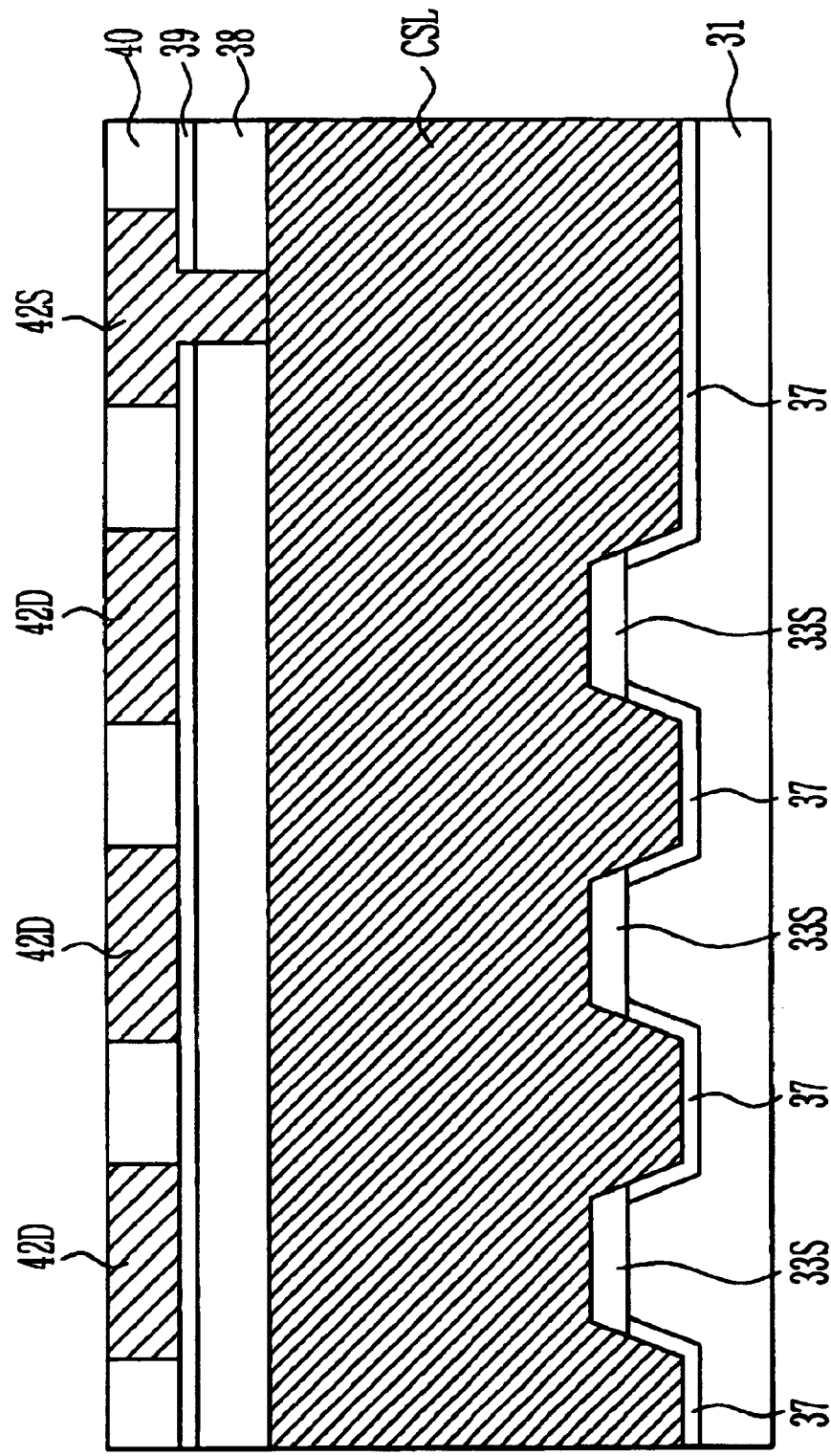

By reference to FIGS. 6A and 6B, a metal is deposited on the entire structure so that the damascene patterns 41S, 41D, 41P and 41G are buried. A blanket etch process is then performed until the top surface of the trench insulating film 40 is exposed, thus forming so that a metal wire 42S connected to the common source line CSL, a bit line 42D connected to the cell drain region 33D, a metal wire 42G connected to a gate of the peri-transistor PT and a metal wire 42P connected to the source/drain junction 33P of the peri-transistor PT.

As described above, as the aspect ratio of a drain contact hole is reduced while reducing the resistance of a common source line, a cell drain contact plug process can be omitted and a contact mask process can be reduced. Therefore, it is possible to simplify the process and improve the productivity. Further. As the process margin can be secured, it is possible to improve reliability and yield of the device.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method of manufacturing a NAND flash memory device, comprising the steps of:
   providing a semiconductor substrate in which a plurality of isolation films are formed in parallel to each other, a source select transistor having a cell source region, a plurality of memory cells having a cell impurity region and a drain select transistor having a cell drain region are serially connected and formed in each of a plurality of strings in a cell region, and a peri-transistor having a source/drain junction is formed in a peripheral circuit region;
   forming a first interlayer insulating film on the resulting semiconductor substrate;
   etching a portion of the first interlayer insulating film to expose the cell source regions and the isolation films between the regions, and then etching the exposed portions of the isolation films to form a common source line contact hole through which the semiconductor substrate is exposed;
   performing an ion implantation process to form an ion implantation region on the exposed semiconductor substrate at the bottom of the common source line contact hole; and
   burying a conductive material within the common source line contact hole in which the ion implantation region is formed, thus forming a common source line.

2. The method of claim 1, before the step of forming the first interlayer insulating film, further comprising the step of forming an etch-stop film having a higher etch selective ratio than that of the first interlayer insulating film on the resulting semiconductor substrate.

3. The method of claim 2, wherein the step of forming the common source line contact hole comprises the steps of:
   etching a portion of the first interlayer insulating film to expose the etch-stop film; and
   etching the exposed etch-stop film to expose the cell source regions and the isolation films between the regions and then etching the exposed isolation films to expose the semiconductor substrate.

4. The method of claim 1, wherein the common source line contact hole includes, at its bottom, a continuous conductive line consisting of the cell source regions and the ion implantation regions formed between the cell source regions.

5. The method of claim 1, wherein the impurity ion implantation process is performed at a dose of 1E12 to 1E14 atom/cm$^2$ with an implantation energy of 15 keV to 25 KeV, using arsenic or phosphorous as an impurity ion.

6. The method of claim 5, wherein the impurity ion implantation process is performed simultaneously with tilt implantation.

7. The method of claim 6, wherein, at the time of the tilt implantation, a wafer is rotated.

8. The method of claim 1, wherein the step of forming the common source line comprises the steps of:
   depositing a doped polysilicon as the conductive material on the first interlayer insulating film so that the common source line contact hole, in which the ion implantation region is formed, is buried; and
   etching the deposited doped polysilicon layer until the first interlayer insulating film is removed to a given thickness by means of a blanket etch process.

9. The method of claim 8, wherein the blanket etch process is performed until the top surface of the source select transistor is exposed.

10. The method of claim 1, after the step of forming the common source line, further comprising the steps of:

forming a second interlayer insulating film on the first interlayer insulating film including the common source line;

forming a trench etch-stop film and a trench insulating film on the second interlayer insulating film sequentially;

forming a plurality of damascene patterns simultaneously by means of a damascene process; and burying a metal within the damascene patterns to form a metal wire connected to the common source line, a bit line connected to the cell drain region, a metal wire connected to a gate of the peri-transistor, and a metal wire connected to the source/drain junction of the peri-transistor, separately.

* * * * *